United States Patent
Jacobson et al.

(10) Patent No.: US 10,325,037 B2
(45) Date of Patent: Jun. 18, 2019

(54) SYSTEM AND METHOD FOR ANALYZING OPERATION OF COMPONENT OF MACHINE

(71) Applicant: Caterpillar Inc., Peoria, IL (US)

(72) Inventors: Evan E. Jacobson, Edwards, IL (US); Qiang Chen, Dunlap, IL (US); Michael D. Anderson, Germantown Hills, IL (US); Nathan S. Pauli, Peoria, IL (US); Benjamin J. Hodel, Dunlap, IL (US)

(73) Assignee: Caterpillar Inc., Deerfield, IL (US)

( * ) Notice: Subject to any disclaimer, the term of this patent is extended or adjusted under 35 U.S.C. 154(b) by 427 days.

(21) Appl. No.: 15/140,521

(22) Filed: Apr. 28, 2016

(65) Prior Publication Data
US 2017/0316125 A1  Nov. 2, 2017

(51) Int. Cl.
*G06F 17/50* (2006.01)
*G06F 17/30* (2006.01)
*G06F 16/25* (2019.01)

(52) U.S. Cl.
CPC ........ *G06F 17/5009* (2013.01); *G06F 16/254* (2019.01)

(58) Field of Classification Search
CPC ............. G06F 17/5009; G06F 17/5018; G06F 11/261; G06F 11/079; G06F 11/008; G06F 17/5095; G05B 23/0245; G05B 23/0243; G05B 23/0248; G05B 23/02; G05B 23/0256; E02F 9/267
See application file for complete search history.

(56) References Cited

U.S. PATENT DOCUMENTS

| | | |
|---|---|---|
| 6,950,782 B2 | 9/2005 | Qiao et al. |
| 7,328,128 B2 | 2/2008 | Bonanni et al. |
| 7,499,777 B2 | 3/2009 | Grichnik et al. |
| 7,930,085 B2 | 4/2011 | Anderson et al. |
| 8,180,610 B2 | 5/2012 | Blaser et al. |
| 8,543,280 B2 | 9/2013 | Ghimire et al. |
| 9,043,078 B2 | 5/2015 | Johnson et al. |

(Continued)

FOREIGN PATENT DOCUMENTS

| | | |
|---|---|---|
| GB | 2504268 | 1/2014 |
| JP | 2007323219 | 12/2007 |

(Continued)

*Primary Examiner* — Brian W Wathen
(74) *Attorney, Agent, or Firm* — Miller, Matthias & Hull

(57) ABSTRACT

A system for analyzing one or more operations associated with a component of a machine is disclosed. The system includes a data warehouse for storing data associated with the machine. The system includes a data extraction module, which extracts the data from the data warehouse and receives a customer input. The data extraction module generates an input parameter based on the data from the data warehouse and the customer input. The system includes a failure injection module for storing information of the one or more failures associated with the component of the machine. The system also includes a machine model, which is in communication with the data extraction module and the failure injection module. The machine model derives an output parameter associated with the one or more operations of the component of the machine, based on the input parameter and the information of the one or more failures.

18 Claims, 6 Drawing Sheets

(56) References Cited

U.S. PATENT DOCUMENTS

| | | | |
|---|---|---|---|
| 2004/0039499 A1* | 2/2004 | Felke | G06F 17/30595 701/29.3 |
| 2004/0176887 A1* | 9/2004 | Kent | G05B 23/0221 701/29.5 |
| 2005/0065678 A1* | 3/2005 | Smith | G06Q 10/00 701/31.4 |
| 2006/0041417 A1* | 2/2006 | Palladino | G06F 11/261 703/14 |
| 2006/0126608 A1* | 6/2006 | Pereira | G05B 13/042 370/360 |
| 2008/0228338 A1* | 9/2008 | Howard | G05B 23/0254 701/31.4 |
| 2008/0270074 A1 | 10/2008 | Horkavi et al. | |
| 2009/0299713 A1* | 12/2009 | Miller | G05B 17/02 703/8 |
| 2014/0107912 A1 | 4/2014 | Yucel et al. | |
| 2016/0203657 A1* | 7/2016 | Bell | G05B 23/0272 701/29.1 |
| 2016/0259870 A1* | 9/2016 | Greenspan | G06F 17/5009 |
| 2017/0178419 A1* | 6/2017 | Paridel | G07C 5/008 |

FOREIGN PATENT DOCUMENTS

| | | |
|---|---|---|
| JP | 2007334136 | 12/2007 |
| JP | 2014203314 | 10/2014 |

\* cited by examiner

SYSTEM AND METHOD FOR ANALYZING OPERATION OF COMPONENT OF MACHINE

TECHNICAL FIELD

The present disclosure relates to a system and a method for analyzing one or more operations associated with a component of a machine.

BACKGROUND

New product introduction of a machine employs virtual product development. The virtual product development includes developing a simulation model of the machine. The simulation model imitates the real world operation of the machine. One or more operations of the machine may be analyzed using the simulation model. The simulation model may include a set of mathematical equations such as, but is not limited to, dynamical systems, statistical models, and differential equations. The solution of the set of mathematical equations may be analogous to an output of the real time operations performed by the machine. Generally, in order to understand operations of the machine, one or more input parameters are introduced to the simulation model. The simulation model generates output parameters corresponding to the input parameters. The existing simulation models select input parameters stored in a database. Moreover, the input parameters are selected randomly without considering a desired output parameter selected by a customer.

US Patent Publication Number 2014/0107912 discloses a method and system for analyzing and improving driver and vehicle performance. Detailed vehicle data, including high frequency time series data, which was collected during a trip, is obtained, as well as external data regarding trip route and environment. Using the data and a model of the physics of the vehicle, driver and vehicle time series may be obtained for the trip. These time series may allocate fuel consumption to various factors relating to the driver such as, rate of acceleration, choice of gear, and to the vehicle such as, choice of engine and aerodynamic improvements. From trip simulations run with virtual drivers, an optimal virtual driver can be obtained. Simulations with the optimal driver can find an optimal vehicle from a set of virtual vehicles. Losses due to driver behavior and to vehicle configuration can be computed by comparisons, and alternatives suggested.

SUMMARY OF THE DISCLOSURE

One aspect of the present disclosure relates to a system for analyzing one or more operations associated with a component of a machine. The system includes a data warehouse for storing data associated with the machine. The data warehouse collects the data from the machine using a telematics system. The system further includes a data extraction module. The data extraction module is configured to extract the data from the data warehouse and to receive a customer input. The data extraction module is also configured to generate an input parameter based on at least one of the data from the data warehouse and the customer input. The system includes a failure injection module. The failure injection module is configured to store information of the one or more failures associated with the component of the machine. The system also includes a machine model. The machine model is in communication with the data extraction module and the failure injection module. The machine model is configured to derive an output parameter associated with the one or more operations of the component of the machine. The output parameter is derived based on at least one of the input parameter and the information of the one or more failures.

Another aspect of the present disclosure relates to a method of analyzing one or more operations associated with a component of a machine. The method includes extracting data associated with the machine from a data warehouse. The method further includes identifying the one or more operations associated with the component based on at least one of a pattern recognition mechanism and a customer input. The method also includes generating an input parameter corresponding to the one or more operations based on the data received from the data warehouse. The method further includes receiving information of the one or more failures associated with the component of the machine from a failure injection module and the input parameter. The method also includes deriving an output parameter associated with the one or more operations. The output parameter is derived based on at least one of the input parameter and the information of the one or more failures.

Another aspect of the present disclosure relates to a computer program product embodied in a computer for analyzing one or more operations associated with a component of a machine. The computer program product is configured to implement operations. The operations include receiving data associated with the component of the machine. The operations also include identifying the one or more operations associated with the component based on at least one of a pattern recognition mechanism and a customer input. The operations also include generating an input parameter corresponding to the one or more operations based on the data received from the data warehouse. The operations further include receiving information of the one or more failures associated with the component of the machine from a failure injection module and the input parameter. The operations include deriving an output parameter associated with the one or more operations. The output parameter is derived based on at least one of the input parameter and the information of the one or more failures.

Other features and aspects of this disclosure will be apparent from the following description and the accompanying drawings.

DETAILED DESCRIPTION

Figure 1:
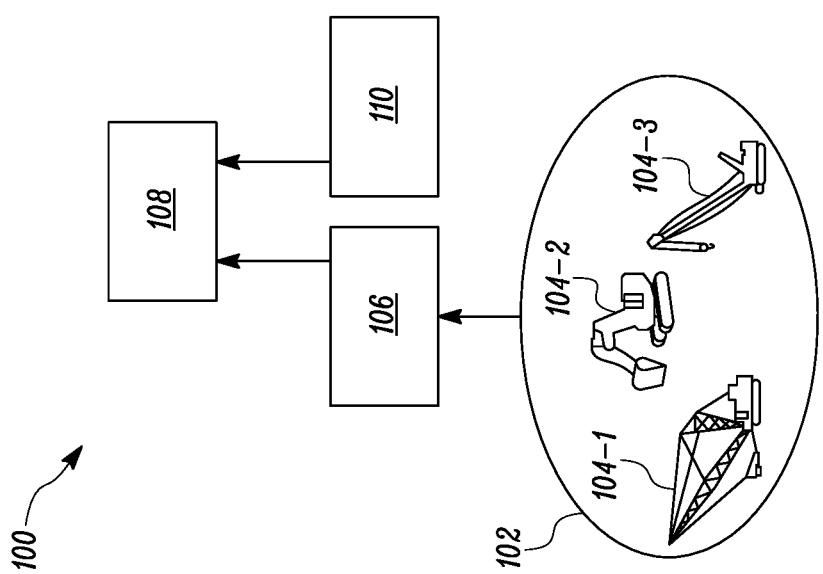
FIG. 1 is an exemplary environment showing a worksite connected to an operation analyzing system, according to an embodiment of the present disclosure.

Wherever possible, the same reference numbers will be used throughout the drawings to refer to the same or the corresponding parts. FIG. 1 illustrates an exemplary environment 100 including a worksite 102. The worksite 102 has multiple machines 104-1, 104-2, 104-3, which together, hereinafter, referred to as 'the machines 104'. The machines 104 may be deployed at the worksite 102 and configured for performing one or more operations such as, transportation of material from one location to another location. The machines 104 may be, for example, mining trucks, haul trucks, on-highway trucks, off-highway trucks, articulated trucks, and any other machines used for performing earth moving operations at the worksite 102. Further, a number of different loading machines may also be deployed at the worksite 102. The loading machines are configured to load the material onto other machines at the worksite 102. The loading machines may include, for example, conveyors, wheel loaders, track-type loaders, shovels, draglines, cranes and any other machine used for performing excavation operation at the worksite 102. The machines 104 deployed at the worksite 102 may also include manned machines, autonomous machines and/or semi-autonomous machines. It may be contemplated that the environment 100 may include multiple worksites. However, for explanation purpose of the present disclosure, one of the machines 104 is discussed in detail and, hereinafter, referred to as 'the machine 104'.

As illustrated in the FIG. 1, a telematics system 106 is in communication with the machine 104 deployed at the worksite 102. The telematics system 106 may be configured to monitor and/or read the machine 104. In an embodiment, the telematics system 106 may be configured to receive at least some of telematics data of the machine 104 over a network (not shown). The network may be, but is not limited to, a wide area network (WAN), a local area network (LAN), an ethernet, an internet, an intranet, a cellular network, a satellite network, or any other network for transmitting data between the machine 104 and the telematics system 106. In various embodiments, the network may include a combination of two or more of the aforementioned networks and/or other types of networks known in the art. The network may be implemented as a wired network, a wireless network or a combination thereof. Further, data may be transmitted over the network with a network protocol, for example, in an encrypted format, or any other secure format known in the art.

The telematics data associated with the machine 104 may include, but is not limited to, location, utilization, specification and health of the machine 104. The telematics data may also include parameters related to operation of the machine 104, for example, speed, heading direction, location of the machine 104, or any other telematics sensory information associated with the machine 104. The telematics data may also include a unique identifier of the machine 104.

An operation analyzing system 108 is in communication with the telematics system 106. The operation analyzing system 108 is configured to analyze one or more operations associated with a component of the machine 104. The component of the machine 104 may include, but is not limited to, an engine system, a loader, a transmission system, a brake system, and any other system associated with the machine 104. In one embodiment, the operation may include, but is not limited to, one or more failures, and an application of the machine 104. The operation analyzing system 108 is hereinafter referred to as 'the system 108' and explained in detail with reference to FIGS. 2 to 5.

A customer input module 110 is also communicated to the system 108. The customer input module 110 is configured to receive inputs from a customer. The customer input module 110 may be a graphical user interface (GUI). The GUI may be at least one of a touch based interface, a keyboard based interface, a pointing device based interface (e.g., a mouse), and a combination thereof. In one example, an expert's opinion on operational boundary conditions of the machine 104 and customer complains regarding an operating condition of the machine 104 may be considered as the input from the customer.

Figure 2:
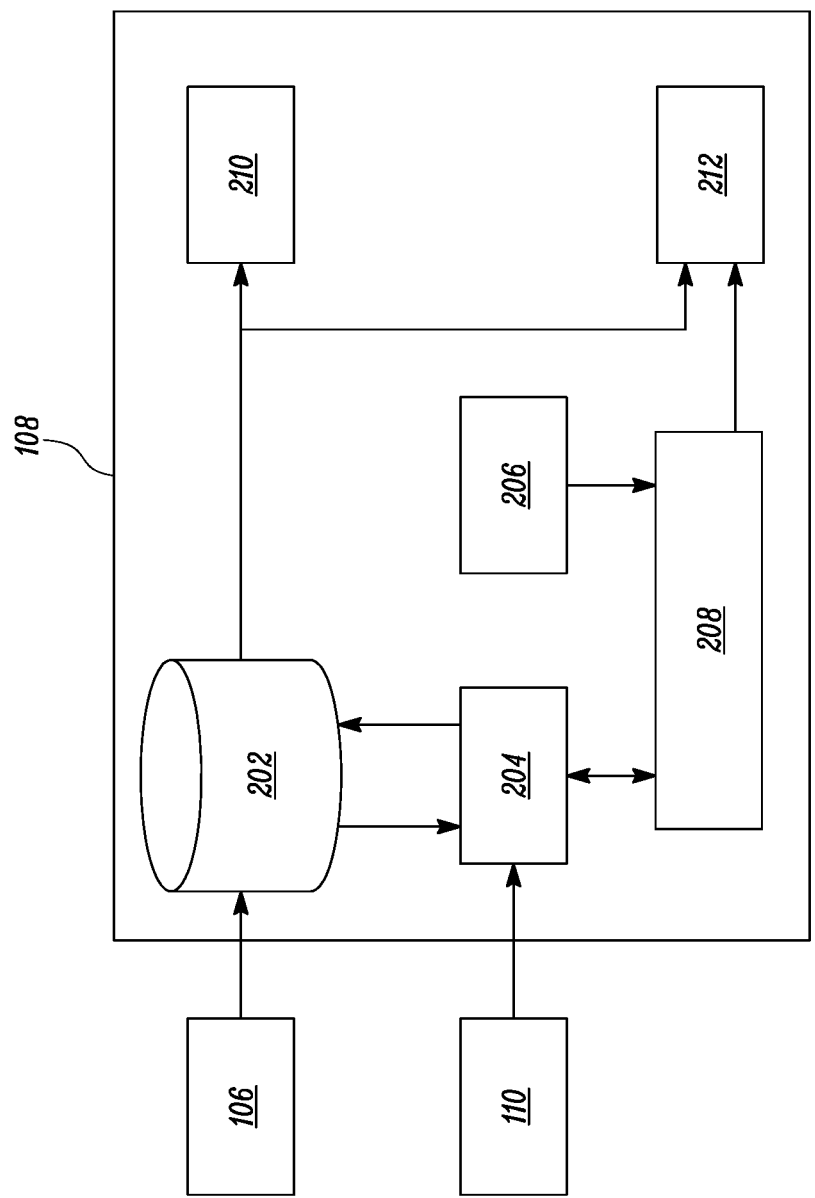
FIG. 2 is a block diagram of the operation analyzing system analyzing one or more components of a machine, according to an embodiment of the present disclosure.

Referring to FIG. 2, a block diagram of the system 108 for analyzing the one or more operations of the component of the machine 104 is illustrated. The system 108 includes a data warehouse 202. Referring to FIG. 1 and FIG. 2, the data warehouse 202 is in communication with the telematics system 106. The data warehouse 202 collects the data associated with the machine 104 using a telematics system 106. The data stored in the data warehouse 202 may be used for reporting and analyzing purposes. The data warehouse 202 may store the data in a desired format as known in the art. The data stored in the data warehouse 202 may be subject-oriented, integrated, time-variant and non-volatile. The data includes one or more operating conditions associated with the component of the machine, operating parameters at a worksite and the customer input. The data stored in the data warehouse 202 also includes, but is not limited to, climatic conditions of the worksite 102, terrain information of the worksite 102, engine speed, and an amount of load to be carried by the machine 104. In an example, the data related to the load to be carried by the machine 104 may include an engine load. Further, a drawbar load (not shown) of the machine 104 may be derived based on the engine load and gradient of a work surface.

The system 108 further includes a data extraction module 204. Referring to FIG. 1 and FIG. 2, the data extraction module 204 is in communication with the customer input module 110 and the data warehouse 202. The data extraction module 204 is configured to manage an operation analyzing process performed by the system 108. The data extraction module 204 is explained in detail with reference to FIG. 3.

The system 108 also includes a failure injection module 206. The failure injection module 206 employs failure mode and effects analysis (FMEA) mechanism. The FMEA mechanism is implemented to systematically analyze failures of the machine 104. For example, the FMEA mechanism analyzes the failures such as, but is not limited to, performance reduction, efficiency reduction, pressure reduction and variation in temperature. Further, the FMEA mechanism determines multiple causes for the aforesaid failures. For instance, the reduction in pressure and the variation in temperature of the engine may be due to a leak at any of the engine component. The information collected using the FMEA mechanism is stored in the failure injection module 206. The information collected using the FMEA includes multiple possible failures associated with each of the component of the machine 104.

The system 108 further includes a machine model 208. The machine model 208 may include a number of simulation models of various components of the machine 104. The machine model 208 is enabled to simulate a virtual operation of the machine 104 based on an input parameter received from the data extraction module 204. The virtual operation performs an efficiency test for the component of the machine 104. In one example, the virtual operation of the machine 104 is employed to troubleshoot multiple control operations of the component of the machine 104. The machine model 208 receives the generated input parameter corresponding to the one or more operations from the data extraction module 204. The input parameter drives the machine model 208. The machine model 208 derives at least one output parameter based on the input parameter received from the data extraction module 204.

The system 108 also includes a user interaction module 210. The user interaction module 210 is in communication with the data warehouse 202. The user interaction module 210 is configured to communicate with the data warehouse 202 for enabling a user interaction. For example, the user interaction may include querying the data warehouse 202 via the user interaction module 210. The data warehouse 202 is enabled to generate reports from the data stored in the data warehouse 202 using a report generating tool (not shown) based on the query raised by customer. The reports generated by the data warehouse 202 may be displayed in the user interaction module 210. The user interaction module 210 may be a graphic user interface or any other interface known in the art to query the data warehouse 202 and obtain reports therefrom. These reports may be provided to the customer in any format, for example, spreadsheets, maps, charts, graphs, datasheet, statistic curves, data models, diagrams, tables, pictorial representations, or any other graphical or textual output generated by the reporting tool known in the art.

An equipment care advisor 212 is communicated to the data warehouse 202 and the machine model 208. The equipment care advisor 212 receives data stored in the data warehouse 202. The equipment care advisor 212 also receives the derived output parameter from the machine model 208. The equipment care advisor 212 is configured to train an equipment care advisor algorithm. The equipment care advisor algorithm is stored in the equipment care advisor 212. The equipment care advisor algorithm is trained using a set of training data. The training data includes, but is not limited to, electronic data of the machine 104, fluid analysis data of the machine 104, data collected from the equipment inspection, data collected from the maintenance history of the machine 104, data collected from the worksite 102, such as worksite condition, terrain information of the worksite 102, and weather.

In one embodiment, the equipment care advisor 212 may be facilitated to perform a real time processing of the data. In such scenario, the equipment care advisor 212 maintains a communication with the machine model 208 for receiving real time data from the machine model 208. The real time data may include the output parameter derived by the machine 104, and the input parameter provided by the data extraction module 204 for deriving the output parameter. In another embodiment, the equipment care advisor 212 is facilitated to perform a historical data processing of data received from the data warehouse 202. The historical data inter alia may include data processed, received, and generated by the telematics system 106 with regard the machine 104 while performing the one or more operations in the past. Further, the historical data may correspond to data associated with the one or more operations of the machine 104 generated by a lab test, a simulation system, and any other experimentation data performed in a lab.

The equipment care advisor 212 receives the output parameter associated with the machine 104 from the data warehouse 202 and/or the machine model 208 as explained above. Further, the output parameter is compared with historical data of the machine 104. In another embodiment, the output parameter is compared with historical data of peer machines (not shown). The peer machines may have identical specifications of the machine 104. The equipment care advisor 212 may also compare the output parameter with engineering standards of the machine 104. Based on the aforementioned comparisons, the equipment care advisor 212 provides a command indicative of a cause for each of the one or more failures associated with the component of the machine 104. In one example, the equipment care advisor 212 may store the historical data of the machine 104, historical data of the peer machines and the engineering standards in an internal memory of the equipment care advisor 212. In another example, the equipment care advisor 212 may be configured to extracts the historical data of the machine 104, historical data of the peer machines and the engineering standards from a cloud and/or a remote server.

The system 108 illustrated above is exemplary and should not limit the scope of the present disclosure. The functionality of the system 108 described herein is also exemplary. The system 108 may additionally include other components and capabilities not described herein. The environment 100 may additionally include any number of the telematics system 106 and the system 108. Further, architecture and capabilities of the telematics system 106 and the system 108 may vary without departing from the scope of the present disclosure.

Figure 3:
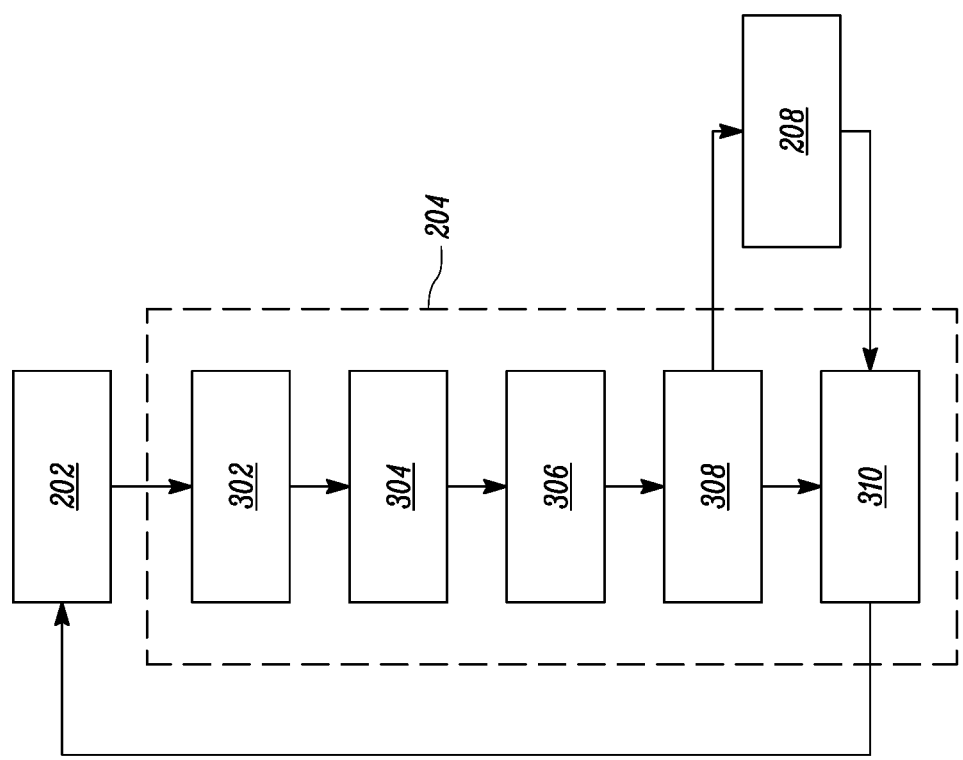
FIG. 3 is a schematic flow diagram illustrating a data extraction module of the operation analyzing system of FIG. 2, according to an embodiment of the present disclosure.

FIG. 3 is a schematic flow diagram illustrating the data extraction module 204 of the system 108, according to an embodiment of the present disclosure. The data extraction module 204 may select the input parameter associated with the machine 104 from the data received from the data warehouse 202. The data extraction module 204 is further configured to identify the input parameter for the machine model 208 based on an input received from the customer through the customer input module 110. In one example, the input parameter may be an operating environment of the machine 104. The operating environment of the machine 104 includes, but is not limited to, terrain condition, and climatic conditions. Similarly, the data extraction module 204 is also configured to determine multiple operating parameters of the machine 104. The operating parameters may include, but is not limited to, engine torque, and engine speed.

As mentioned earlier, the data extraction module 204 is connected to the customer input module 110. This enables the data extraction module 204 to receive a customer feedback regarding a performance of the machine 104. The customer input module 110 also receives expert's opinion regarding the machine 104. The expert's opinion may be considered as the customer feedback. In one example, the data extraction module 204 may select the customer feedback as the input parameter. In another example, the data extraction module 204 employs a proportional integral (PI) controller known in the art. The PI controller may be implemented to adjust the operational boundary conditions of the machine model 208. The adjustment of the operational boundary conditions may imply that the output parameter collected by the data extraction module 204 from the machine model 208 have a low regression error with respect to a predefined operational parameter of the machine 104.

Referring to FIG. 3, at a block 302, the data extraction module 204 identifies the one or more operations associated with the component of the machine 104 based on at least one of a pattern recognition mechanism and the customer input. Further, at a block 304, the data extraction module 204 generates the input parameter from at least one of the data received from the data warehouse 202 and the customer input based on the identified operation. It may be contemplated that the data extraction module 204 may be configured to select multiple input parameters, without limiting the scope of the disclosure. At a block 306, the generated input parameter is validated based on at least one of specifications of the machine 104, the identified operation of the machine 104 and the operating conditions at the worksite 102. If the input parameter is not valid, then the data extraction module 204 terminates the process. If the input parameter is valid, then the data extraction module 204 executes operation at a block 308. In another embodiment, the validated input may be scaled based on the specification of the machine 104 if the input parameter is valid. Also, the scaled input parameter is converted to an alias file for future use.

At the block 308, the data extraction module 204 performs a set of background operations. As a first step, a work cycle model (WCM) is launched from the graphical user interface. Then, the data extraction module 204 executes the WCM and communicates the input parameter to the machine model 208. The machine model 208 is driven based on the input parameters send by the data extraction module 204. The machine model 208 derives the output parameter based on the input parameter. At a block 310, the data extraction module 204 extracts the derived output parameter from the machine model 208. The extraction module is further configured to communicate the output parameter to the data warehouse 202.

In another embodiment, the pattern recognition mechanism may be embodied within the data extraction module 204. The pattern recognition mechanism is configured to screen the one or more operations of the component of the machine 104. Screening of the one or more operations may be performed to identify application of the machine 104 and working environment of the machine 104. The pattern recognition mechanism is further configured to cluster the one or more operations into at least one cluster based on a shared feature and/or character of the operations. In one example, the pattern recognition mechanism may be configured to cluster the one or more operations into multiple clusters. This enables the data extraction module 204 to rectify features of a failure associated with the component of the machine 104. The multiple clusters may belong to various sets of applications and operating environments. Moreover, in another example, the pattern recognition mechanism is trained by the information of one or more failures stored in the failure injection module 206.

In yet another embodiment, the data extraction module 204 is implemented to perform an integrity check on the data received via the telematics system 106 and stored in the data warehouse 202. In order to perform the integrity check, the data extraction module 204 aligns the output parameter from the machine model 208 with the real time data received from the data warehouse 202.

Figure 4:
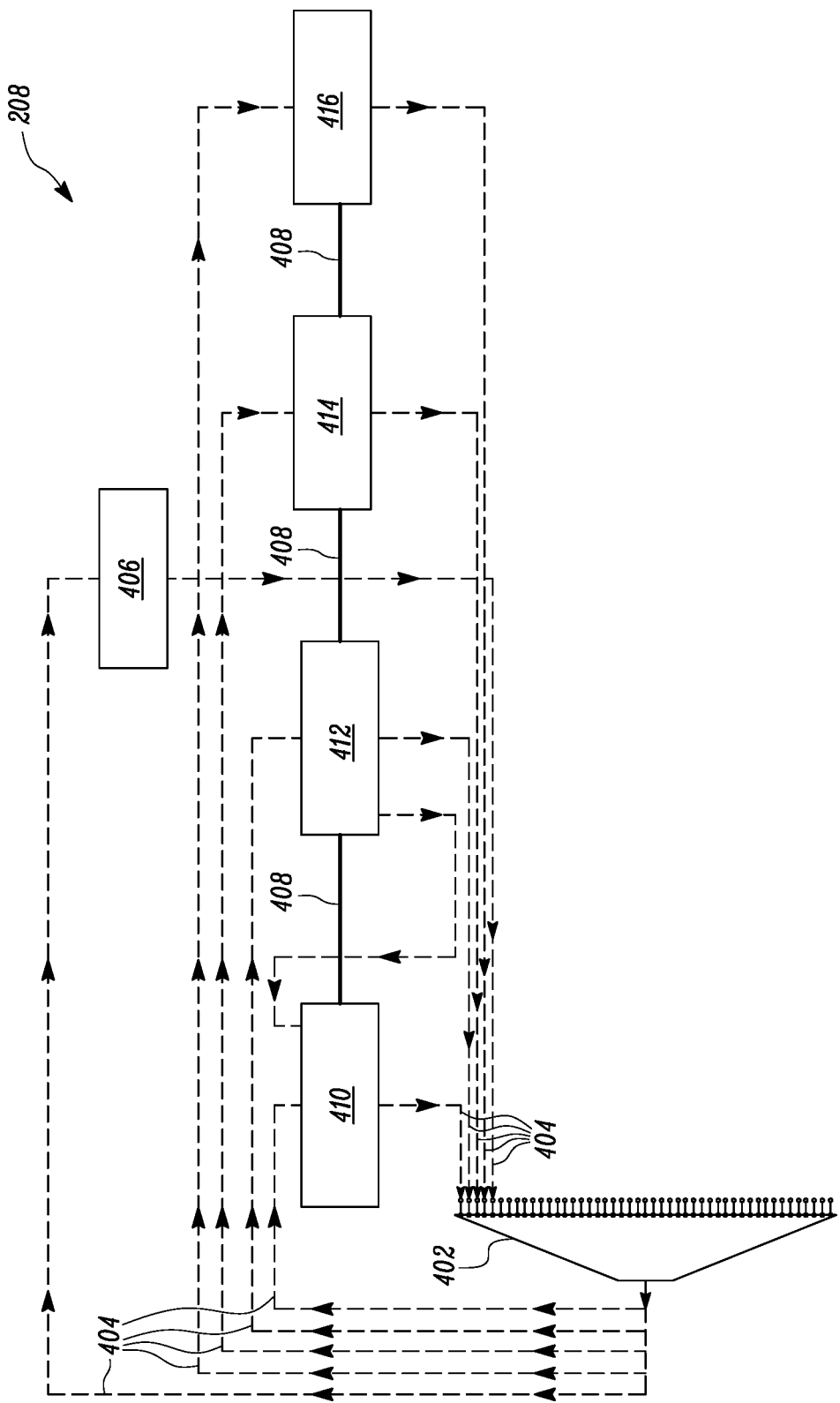
FIG. 4 is a schematic representation of a machine model implemented in the operation analyzing system of FIG. 2, according to an embodiment of the present disclosure.

FIG. 4 illustrates a schematic diagram of an exemplary machine model 208. The machine model 208 receives the input parameter from the data extraction module 204. The machine model 208 also receives information regarding one or more failures associated with the component of the machine 104 from the failure injection module 206. The machine model 208 derives the output parameter based on the input parameter and the information from the failure injection module 206. It may be contemplated that the machine model 208 may be enabled to receive multiple input parameters and derive multiple output parameters.

As illustrated in FIG. 4, the machine model 208 includes multiple simulation models of various components of the machine 104 such as, but is not limited to engine system, transmission system, hydraulic system, and chassis system. The simulation models of the machine model 208 are communicably coupled to a multiplexer 402 using data bus 404. The multiplexer 402 multiplexes the data received from each of the simulation models and generate a signal. The generated signal is communicated to each of the simulation models as feedback. The generated signal is also sent to a controller 406. The controller 406 may be configured to provide a control flow to the virtual operation of the machine 104. In real time, various components of the machine 104 are connected by a physical connection. The physical connection may be a mechanical connection, and/or a hydraulic connection. In the machine model 208, the simulation models of various components of the machine model 208 may be interconnected using a simulated connection 408. The simulated connection 408 may be analogous to the physical connection of the machine 104.

The machine model 208, as illustrated in FIG. 4, includes an engine simulation model 410. The engine simulation model 410 simulates multiple operations performed by an engine system (not shown) of the machine 104. The engine simulation model 410 constitutes a set of mathematical relationships corresponding to the engine system of the machine 104. The engine simulation model 410 is connected to the multiplexer 402 via the data bus 404. The engine simulation model 410 is connected to a transmission simulation model 412 via the simulated connection 408. The transmission simulation model 412 is configured to simulate the transmission system (not shown) of the machine 104. In one embodiment, the engine simulation model 410 is communicated to the transmission simulation model 412 using the data bus 404. The transmission simulation model 412 is connected to a lower power train (LPT) simulation model 414. The LPT simulation model 414 is communicated to a machine chassis simulation model 416. The machine chassis simulation model 416 is also enabled to communicate to the multiplexer 402 using the data bus 404. The machine model 208 further includes a triggering model (not shown). The triggering model is configured to initiate the virtual operation of the machine model 208.

In one example, the input parameter selected by the data extraction module 204 may be an amount of load to be carried by the machine 104. The input parameter is provided to the machine model 208 as an input signal. The input signal triggers the controller 406. The triggering model initiates the virtual operation of the machine model 208. Further, the controller 406 and corresponding control loops are triggered. The controller 406 generates a control signal and sends it to the multiplexer 402. The engine simulation model 410, the transmission simulation model 412, the LPT simulation model 414, and the machine chassis simulation model 416 of the machine model 208 collectively performs a set of predefined calculations and derives the output parameters, such as engine performance and transmission performance. The derived output parameter is communicated to the data extraction module 204.

In another example, a transmission design engineer may need to know a torque generated by the engine system of the machine 104. The machine 104 may not have a sensor to directly measure the torque. However, the machine 104 may include a speed sensor and other additional sensors that may directly measure some of the operating parameters of the machine 104. Hence, the engine simulation model 410 may be configured to derive the output parameter, such as the torque based on the input parameter, such as the speed.

Figure 5:
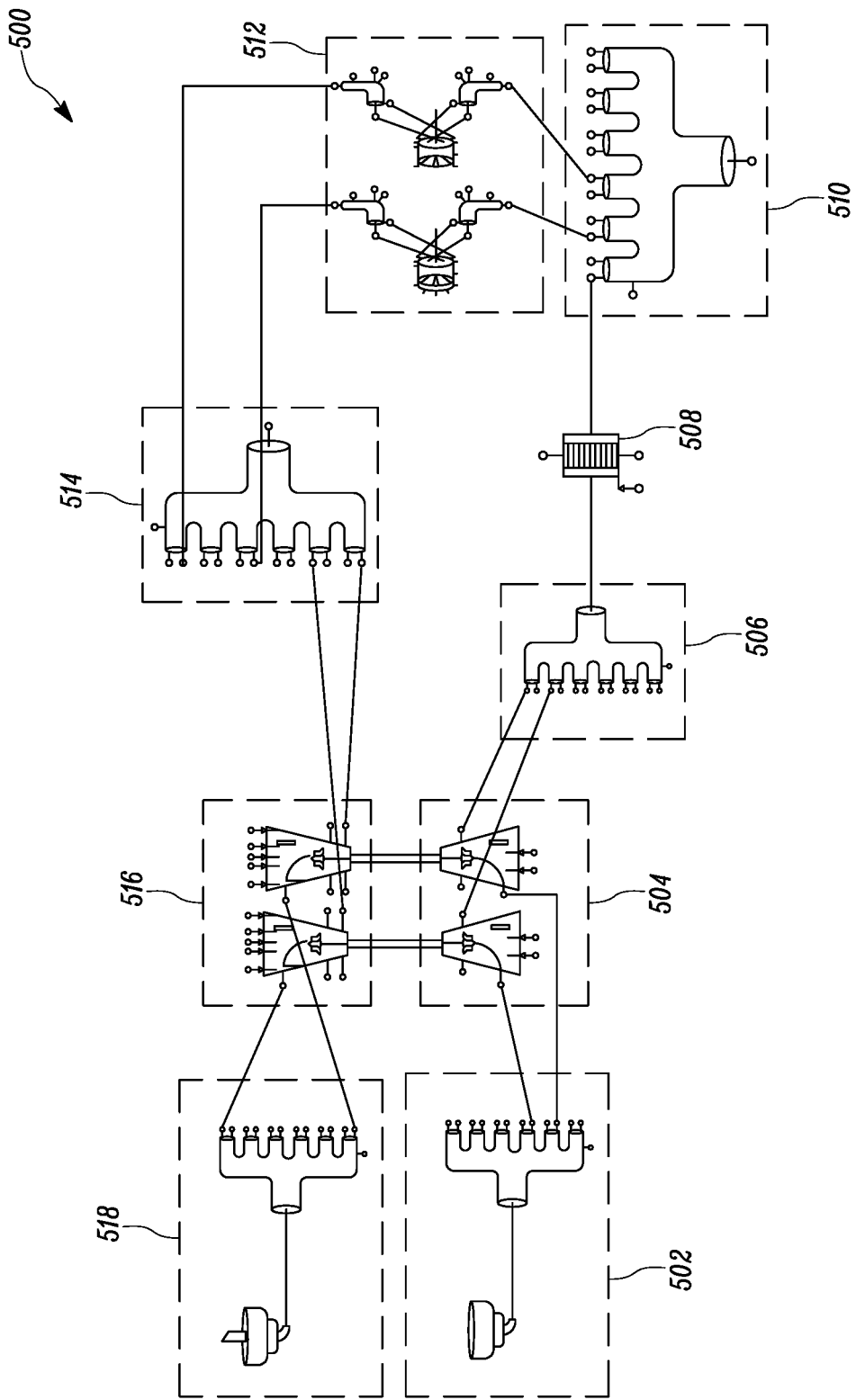
FIG. 5 is a schematic representation of an exemplary fluid flow system of an engine system of the machine.

FIG. 5 is a schematic representation of a fluid flow system 500 of the engine system of the machine 104 showing failures of one or more components associated therewith. The fluid flow system 500 includes various components, such as, a compressor intake manifold 502, a compressor blade 504, a compressor exhaust manifold 506, an air cooler 508, an intake manifold 510, a cylinder unit 512, a turbine intake manifold 514, a turbine blade 516, a turbine exhaust manifold 518 of the fluid flow system 500 of the engine system of the machine 104. The information regarding the operations is derived based on a model of the components of the machine 104. The engine model as illustrated in FIG. 5 includes a model associated with the compressor intake manifold 502 for receiving air from atmosphere. The air from the compressor intake manifold 502 is sent to the compressor blade 504. Further, compressed air from the compressor blade 504 is passed to the compressor exhaust manifold 506 and then to the intake manifold 510 via the air cooler 508. The air from the intake manifold 510 is sent to the cylinder unit 512 of the engine. Exhaust gas from the cylinder unit 512 is sent to the turbine intake manifold 514. The turbine intake manifold 514 is connected to the turbine blade 516 in order to run the turbine. The exhaust gas from the turbine is sent to the atmosphere through the turbine exhaust manifold 518 connected to the turbine blade 516.

From the aforementioned fluid flow process, multiple locations for possible leaks may be the compressor exhaust manifold 506, the intake manifold 510 and the turbine intake manifold 514. The leaks may occur due to improper coupling of fluid lines or damage in the fluid lines. Leaks at each of the aforesaid components may have a different effect on the performance of the engine system of the machine 104. For instance, a leak at the compressor exhaust manifold 506 may lead to a drop in a pressure and a temperature desired to operate the engine system at a desired volumetric efficiency. The information of one or more failures associated with the fluid flow system 500 is stored in the failure injection module 206. The failure injection module 206 is enabled to identify a cause for the leak based on a drop in performance of the machine 104.

INDUSTRIAL APPLICABILITY

The system 108 and a method 600 of the present disclosure enable analyzing one or more operations of the component of the machine 104 with integrity. The system 108 according to present disclosure may be implemented in virtual product development, which enables understanding of the performance and efficiency of the machine 104 well before the manufacturing thereof. The system 108 derives multiple output parameters of the machine 104 that are not detected using sensors available in the machine 104 based on the various input parameters.

The system 108 employs a reverse engineering process to compute the output parameters and performance of the machine 104 from the input parameters. In one embodiment, the reverse engineering to the data received using the telematics system 106 may virtually represent the worksite 102. This enables an operator to identify the boundary conditions of the operating parameters of the machine 104. The virtual operation of the machine 104 may act as a tool for understanding failure corresponding to each component of the machine 104 and troubleshoot the one or more operations of the component of the machine 104. The equipment care advisor 212 in the system 108 is enabled to determine cause of the failure associated with the component of the machine 104.

The system 108 may be embodied as a computer program product in a computer. The computer program product is enabled to analyze one or more operations associated with the component of the machine 104 according to an embodiment of the present disclosure.

Figure 6:
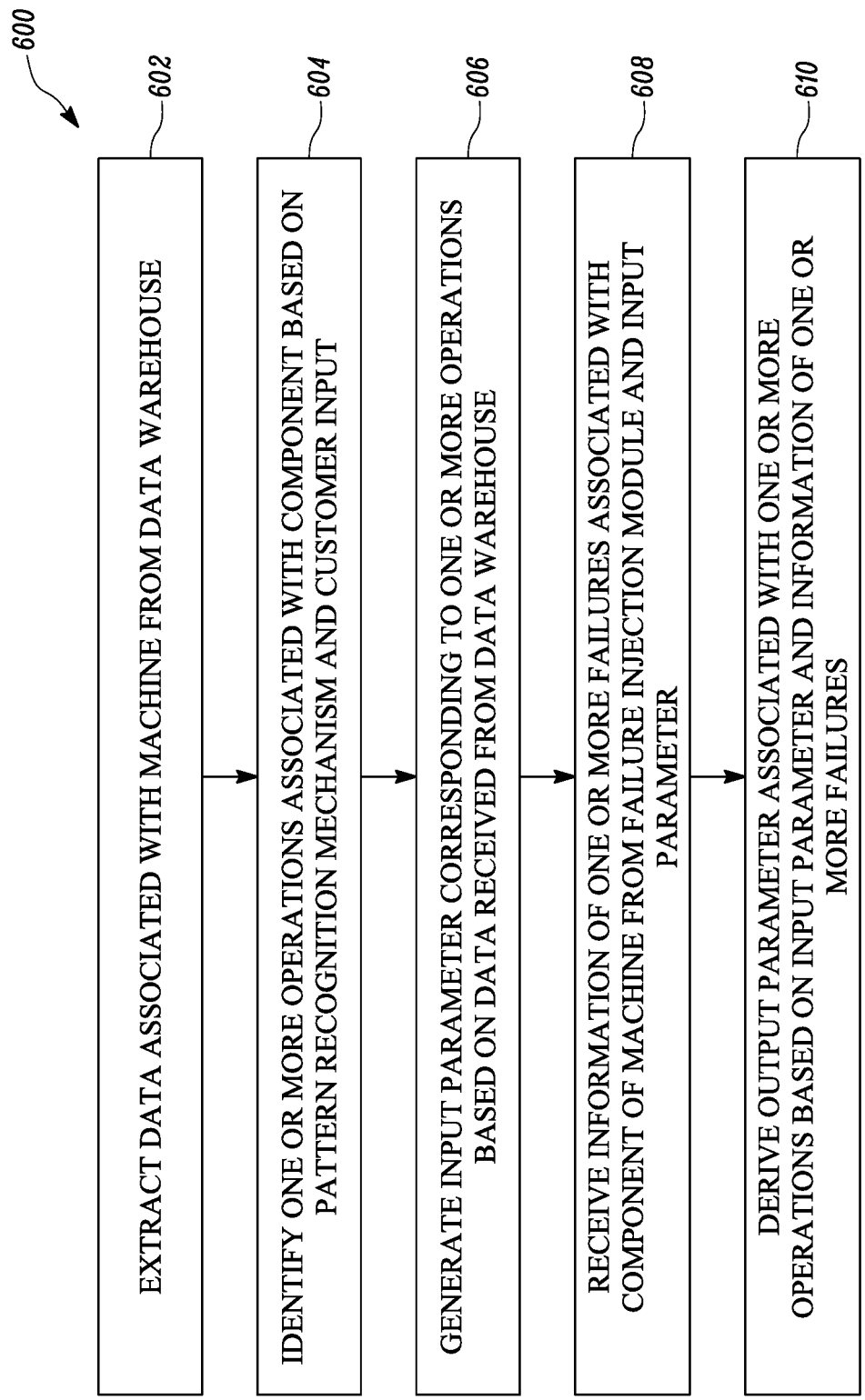
FIG. 6 is a flowchart of a method of analyzing one or more operations associated with a component of the machine, according to an embodiment of the present disclosure.

FIG. 6 illustrates a flow chart of the method 600 of analyzing one or more operations associated with the component of the machine 104, according to an embodiment of the present disclosure. At step 602, the data extraction module 204 receives the data associated with the machine 104 from the data warehouse 202. The data warehouse 202 collects the data using the telematics system 106 from the machine 104 deployed at the worksite 102. The data may include operation parameter of the machine 104 and terrain and weather condition at the worksite 102.

At step 604, the data extraction module 204 identifies the one or more operations associated with the component of the machine 104 based on at least one of the pattern recognition mechanism and the customer input. In one example, the customer input may be a customer complaint and/or an expert's opinion. At step 606, the data extraction module 204 is configured to generate the input parameter. The input parameter is generated based on at least one of the data received from the data warehouse 202 and the customer input. Further, the data extraction module 204 communicates the input parameter to the machine model 208. Further, at step 608, the machine model 208 receives the information of the one or more failures associated with the component of the machine 104 from the failure injection module 206. The machine model 208 is also configured for receiving the input parameter associated with the machine 104 from the data extraction module 204 at step 608.

At step 610, the machine model 208 derives the output parameter associated with the one or more operations based on the input parameter. In order to derive the output parameter from the input parameter, the machine model 208 executes a set of mathematical operations corresponding to the mechanical operation analogous to the real time machine operations. In one example, the output parameter may be an operational parameter, which is not measured using direct measuring methods. For instance, the torque of the engine may be derived using various measurable input parameters of the machine 104 such as the speed of the engine measured via the speed sensor, gear shift position, and a ground speed of the machine 104.

While aspects of the present disclosure have been particularly shown and described with reference to the embodiments above, it will be understood by those skilled in the art that various additional embodiments may be contemplated by the modification of the disclosed machines, systems and methods without departing from the spirit and scope of what is disclosed. Such embodiments should be understood to fall within the scope of the present disclosure as determined based upon the claims and any equivalents thereof.

What is claimed is:

1. A system for analyzing one or more operations associated with a component of a machine, the system comprising:
   a data warehouse for storing data associated with the machine, wherein the data is collected from the machine using a telematics system;
   a data extraction module configured to:
      screen the one or more operations associated with the component of the machine from the data received in the data warehouse based on a pattern recognition mechanism and
      cluster the one or more operations into at least one cluster based on a feature in the data received from the data warehouse;
      extract the data from the data warehouse;
      receive a customer input; and
      generate an input parameter based on at least one of the extracted data and the received customer input;

a failure injection module configured to store information of one or more failures associated with the component of the machine; and
a machine model in communication with the data extraction module and the failure injection module, the machine model configured to derive an output parameter associated with the one or more operations of the component of the machine, based on at least one of the input parameter and the information of the one or more failures.

2. The system of claim 1, wherein the data extraction module is configured to:
identify the one or more operations associated with the component based on the customer input;
generate the input parameter corresponding to the one or more operations from the data received from the data warehouse;
communicate the generated input parameter to the machine model to drive the machine model; and
send the output parameter associated with the one or more operations to the data warehouse, wherein the one or more operations associated with the component of the machine are analyzed based on the output parameter.

3. The system of claim 1, wherein the machine model is configured to:
receive the information of the one or more failures associated with the component of the machine from the failure injection module;
receive the input parameter corresponding to the one or more operations from the data extraction module;
simulating the one or more operations of the machine based on the received information and the input parameter; and
derive the output parameter based on the simulation of the one or more operations.

4. The system of claim 1 further comprising a user interaction module configured to communicate with the data warehouse for enabling a user interaction.

5. The system of claim 1 further comprising an equipment care advisor in communication with the data warehouse, the equipment care advisor configured to:
receive the output parameter associated with the machine from at least one of the data warehouse and the machine model;
compare the output parameter with historical data of the machine; and
provide a command indicating a cause for each of the one or more failures associated with the component of the machine.

6. The system of claim 1, wherein the data warehouse is configured to generate reports based on a query of a customer.

7. The system of claim 1, wherein the machine model comprises a simulation model of at least one of an engine system, a transmission system, a controller, and a multiplexer.

8. A method of analyzing one or more operations associated with a component of a machine, the method comprising:
extracting data associated with the machine from a data warehouse;
identifying the one or more operations associated with the component based on at least one of a pattern recognition mechanism and a customer input;
generating an input parameter corresponding to the one or more operations based on the data received from the data warehouse;
receiving information of one or more failures associated with the component of the machine from a failure injection module and the input parameter corresponding to the one or more operations;
deriving an output parameter associated with the one or more operations based on at least one of the input parameter and the information of the one or more failures;
screening the one or more operations associated with the component of the machine from the data received in the data warehouse; and
clustering the one or more operations into at least one cluster based on a feature in the data received from the data warehouse.

9. The method of claim 8 further comprising, communicating the derived output parameter to the data warehouse.

10. The method of claim 9 further comprising, generating reports from the data warehouse based on a query of a customer.

11. The method of claim 8, further comprising, collecting the data associated with the machine using a telematics system.

12. The method of claim 8 further comprising, generating a virtual operation of the machine for troubleshooting the one or more operations of the component of the machine, wherein the virtual operation of the machine performs an efficiency test for the component of the machine.

13. The method of claim 8, wherein the data comprises one or more operating conditions associated with the component of the machine, machine operating parameters at a worksite, and the customer input.

14. The method of claim 8 further comprising:
receiving the output parameter associated with the machine from the data warehouse;
comparing the output parameter associated with the machine with historical data of the machine; and
providing a command indicative of a cause for each of the one or more failures based on the comparison of the output parameter with the historical data of the machine.

15. The method of claim 8, wherein the machine model comprises a simulation model of at least one of an engine system, a transmission system, a controller, and a multiplexer.

16. A computer program product embodied in a computer for analyzing one or more operations associated with a component of a machine, the computer program product configured to implement operations comprising:
receiving data associated with the component of the machine;
identifying the one or more operations associated with the component based on at least one of a pattern recognition mechanism and a customer input;
generating an input parameter corresponding to the one or more operations based on the data received from a data warehouse;
receiving information of the one or more failures associated with the component of the machine from a failure injection module and the input parameter corresponding to the one or more operations;
deriving an output parameter associated with the one or more operations based on at least one of the input parameter and the information of the one or more failures;
screening the one or more operations associated with the component of the machine from the data received in the data warehouse; and clustering the one or more operations into at least one cluster based on a feature in the data received from the data warehouse.

17. The computer program product of claim 16 configured to implement operations comprising, communicating the derived output parameter to the data warehouse.

18. The computer program product of claim 16 configured to implement operations comprising:
  receiving the output parameter associated with the component of the machine;
  comparing the output parameter associated with the machine with historical data of the machine; and
  providing a command indicative of a cause for each of the one or more operations based on the comparison of the output parameter with the historical data of the machine.

\* \* \* \* \*